(12) United States Patent
Vaidyanathan et al.

(10) Patent No.: US 10,261,923 B2
(45) Date of Patent: Apr. 16, 2019

(54) CONFIGURABLE INTERCONNECT APPARATUS AND METHOD

(71) Applicant: Intel Corporation, Santa Clara, CA (US)

(72) Inventors: Kaushik Vaidyanathan, Santa Clara, CA (US); Daniel H. Morris, Hillsboro, OR (US); Uygar E. Avci, Portland, OR (US); Ian A. Young, Portland, OR (US); Tanay Karnik, Portland, OR (US); Huichu Liu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/660,819

(22) Filed: Jul. 26, 2017

(65) Prior Publication Data

US 2019/0034360 A1 Jan. 31, 2019

(51) Int. Cl.
*G06F 13/40* (2006.01)
*G06F 1/26* (2006.01)
*G06F 13/10* (2006.01)
*G06F 9/445* (2018.01)

(52) U.S. Cl.
CPC ............ *G06F 13/102* (2013.01); *G06F 1/266* (2013.01); *G06F 9/44505* (2013.01); *G06F 13/4022* (2013.01); *G06F 13/4072* (2013.01)

(58) Field of Classification Search
CPC ........ G06F 13/102; G06F 13/14; G06F 13/38; G06F 13/40; G06F 13/4004; G06F 13/4022; G06F 13/4063; G06F 13/4068; G06F 13/4072; G06F 1/266; G06F 1/32; G06F 1/3203; G06F 1/3234; G06F 1/3237; G06F 1/324; G06F 1/325; G06F 1/3253; G06F 1/3287; G06F 1/3296; G06F 9/44505
See application file for complete search history.

(56) References Cited

U.S. PATENT DOCUMENTS

| | | | |
|---|---|---|---|
| 6,732,065 B1 | 5/2004 | Muddu | |
| 7,426,598 B2 * | 9/2008 | Kwa | ............ G06F 1/3203 710/307 |
| 2002/0178321 A1 * | 11/2002 | Calamatas | ............ B61D 19/026 711/1 |
| 2008/0001655 A1 * | 1/2008 | Pham | ............ G06F 1/3203 327/544 |

(Continued)

FOREIGN PATENT DOCUMENTS

WO 2017111876 6/2017

OTHER PUBLICATIONS

International Search Report and Written Opinion from PCT/US2018/039537 dated Oct. 29, 2018, 16 pgs.

*Primary Examiner* — Thomas J Cleary
(74) *Attorney, Agent, or Firm* — Green, Howard, & Mughal LLP

(57) ABSTRACT

Described is an apparatus which comprises: a first electrical path comprising at least one driver and receiver; and a second electrical path comprising at least one driver and receiver, wherein the first and second electrical paths are to receive a same input signal, wherein the first electrical path and the second electrical path are parallel to one another and have substantially the same propagation delays, and wherein the second electrical path is enabled during a first operation mode and disabled during a second operation mode.

17 Claims, 14 Drawing Sheets

(56) References Cited

U.S. PATENT DOCUMENTS

| | | | |
|---|---|---|---|
| 2008/0209246 A1* | 8/2008 | Marks | H04L 12/12 |
| | | | 713/323 |
| 2008/0225881 A1* | 9/2008 | Powell | H04L 12/413 |
| | | | 370/463 |
| 2009/0061918 A1* | 3/2009 | Emara | H04W 52/074 |
| | | | 455/522 |
| 2009/0072246 A1 | 3/2009 | Genrikh et al. | |
| 2011/0096659 A1* | 4/2011 | Cardona | H04L 12/12 |
| | | | 370/220 |
| 2014/0101468 A1* | 4/2014 | Narayanan | G06F 1/3287 |
| | | | 713/320 |
| 2015/0301575 A1* | 10/2015 | Dreps | G06F 1/3243 |
| | | | 713/322 |
| 2016/0140273 A1 | 5/2016 | Alfano et al. | |
| 2017/0177536 A1 | 6/2017 | Snyder et al. | |

* cited by examiner

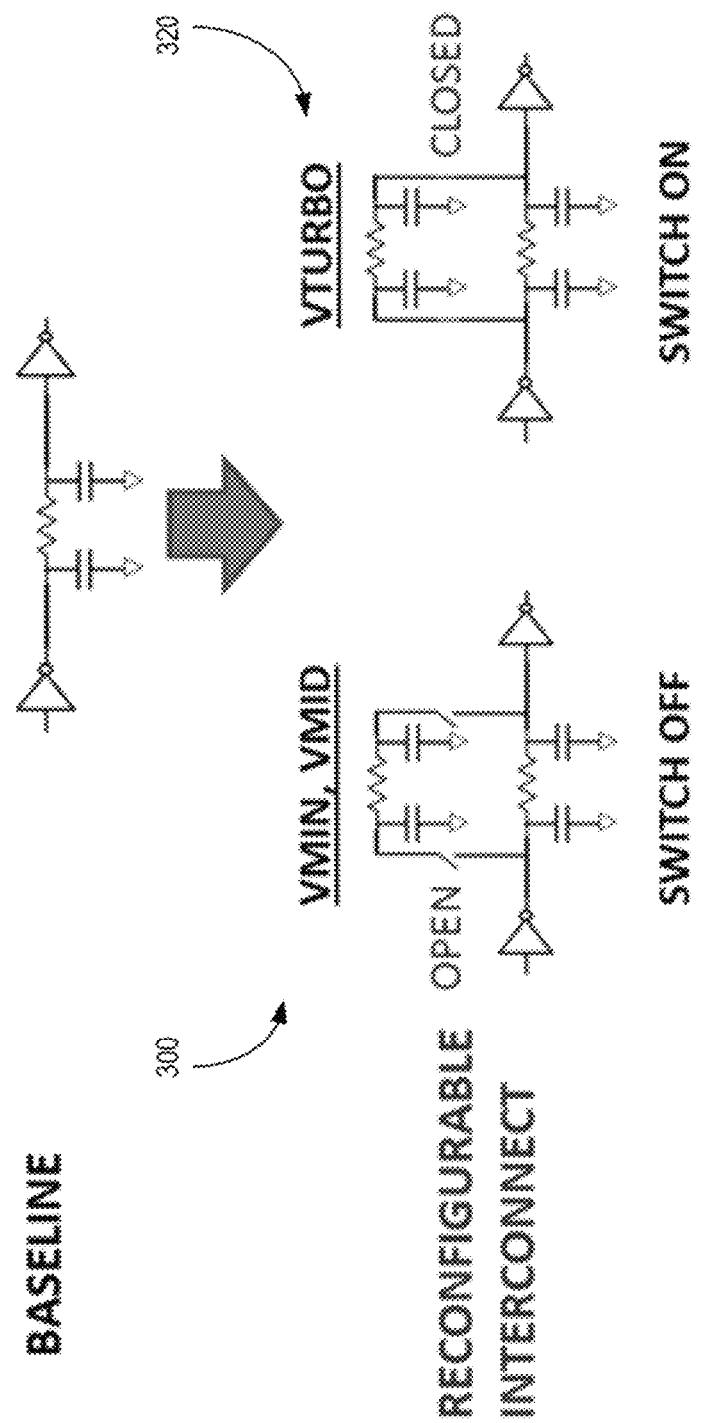

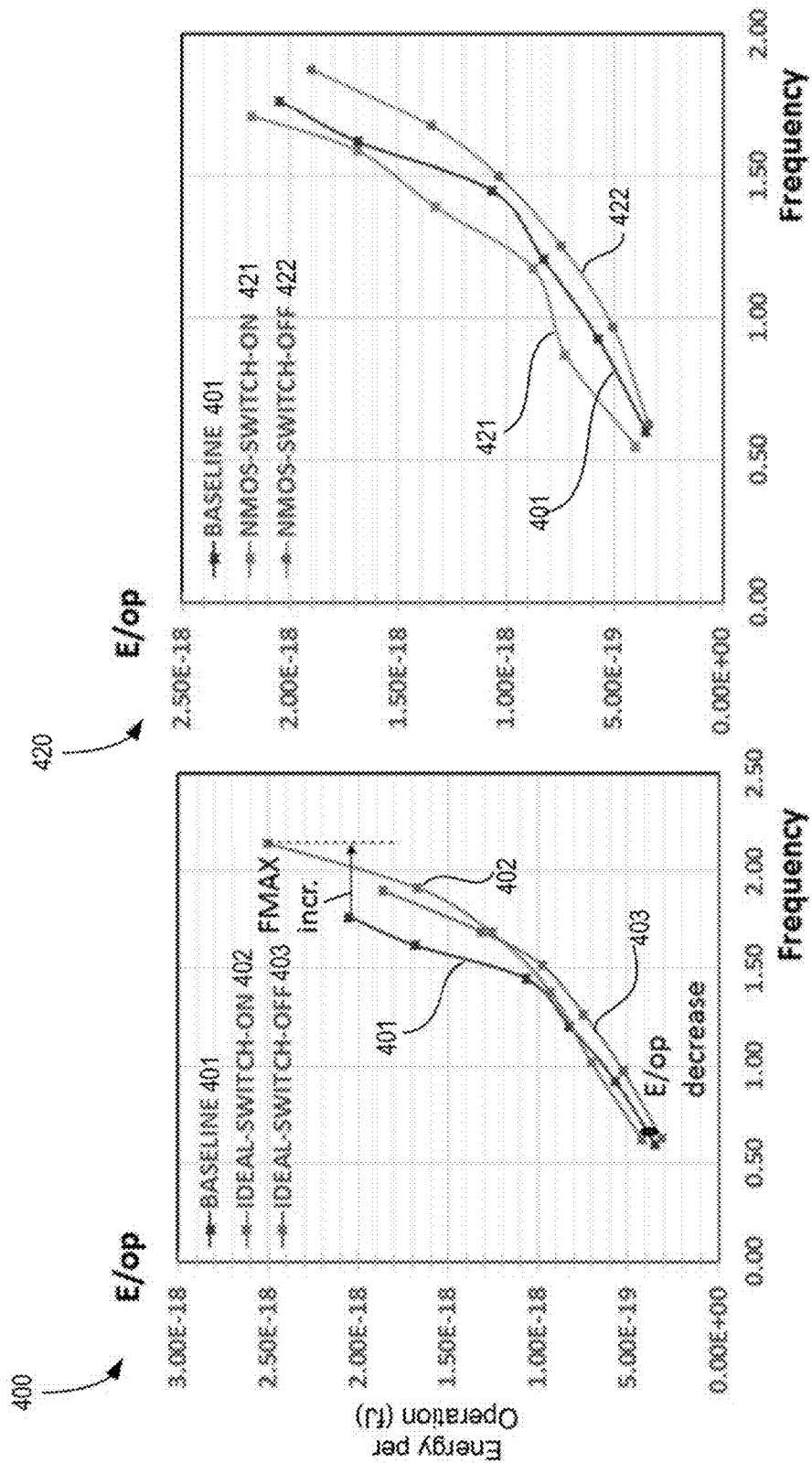

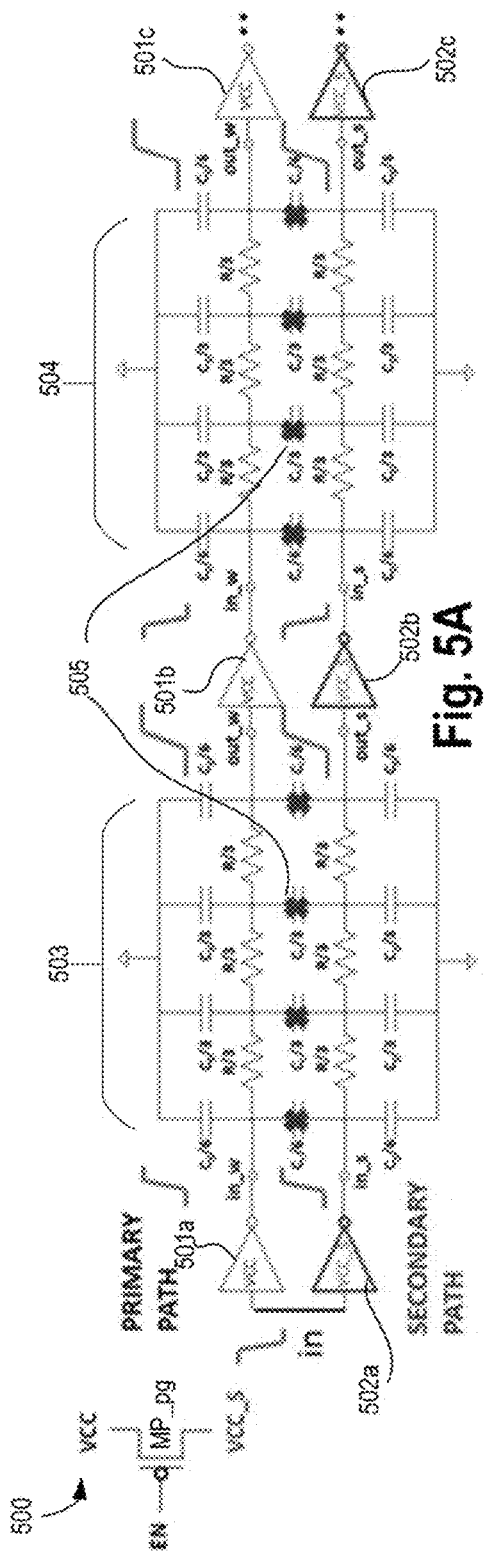
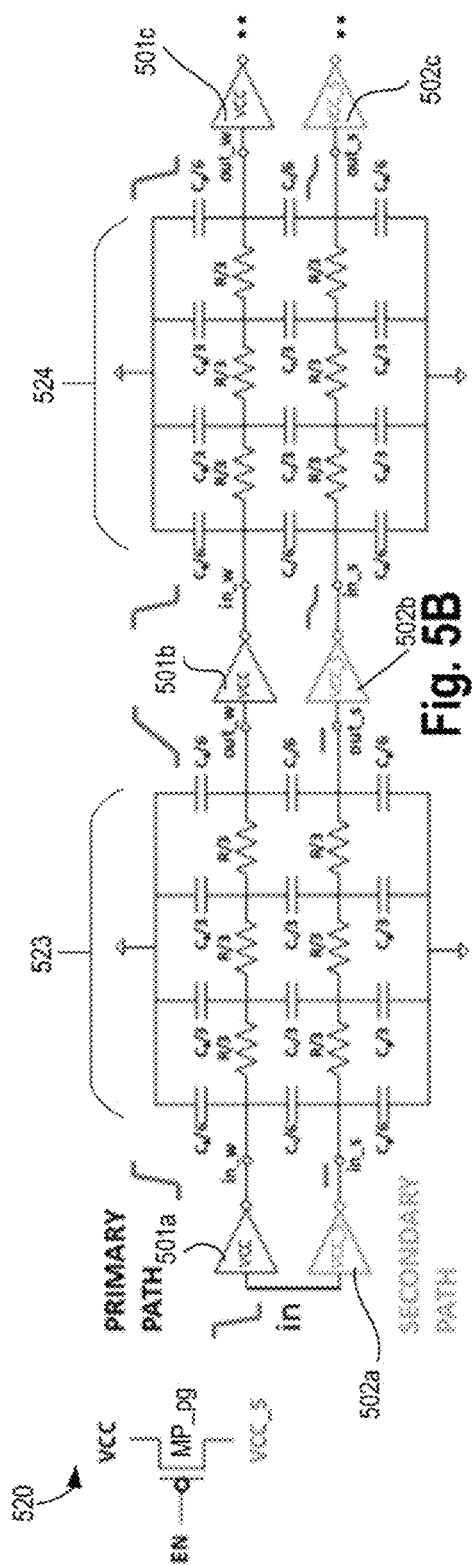
Fig. 5A
Fig. 5B

CONFIGURABLE INTERCONNECT APPARATUS AND METHOD

BACKGROUND

Today, a single product design is required to operate at different supply voltages. For example, the same processor is designed to operate at a high voltage supply (e.g., 1.2 V) and a low voltage supply (e.g., 0.5 V). The supply voltage (or voltage range) may be selected and fixed according to the performance and power requirements of a market segment (e.g., tablet, laptop, desktop, etc.). For example, a processor in the desktop market segment may operate at a higher voltage providing higher frequency and processing speed (e.g., higher performance) while the same processor in a tablet or laptop market segment may operate at a lower voltage and at lower frequency and processing speeds. In most cases, a processor may be required to support a range from the minimum operating voltage (VMIN) to a maximum operating voltage (VMAX). Also, the voltage may be adjusted dynamically during operation (e.g., low power mode, normal mode, turbo mode, etc.).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-B illustrate a baseline design comprising a reconfigurable interconnect using switchable via.

FIG. 4A illustrates a plot showing energy per operation (E/op) using baseline design and ideal switches.

FIG. 4B illustrates a plot showing energy per operation (E/op) using baseline design and n-type (NMOS) switches.

FIG. 5A illustrates an enabled reconfigurable interconnect controlled by power gating, according to some embodiments of the disclosure.

FIG. 5B illustrates a disabled reconfigurable interconnect controlled by power gating, according to some embodiments of the disclosure.

DETAILED DESCRIPTION

The power and performance effects of resistive interconnect depend strongly on the supply voltage. As such, the designs that operate best at low voltages are less efficient operating at high voltages, and vice-versa. Applying one design for different market segments and power modes provides for design and manufacture efficiency, but compromises performance and energy. This compromise may get more severe as interconnect resistance increases with scaling.

Current solutions to designing logic or processors with resistive interconnect are limited to two non-optimal methods. In the first method, the design of the Integrated Circuit (IC) is optimized at a given performance point (e.g., high-performance or low-power). In this case, the other performance target product will suffer significantly operating at sub-optimal power-performance. For example, an IC design optimized to operate at high performance (e.g., high frequency) may result in sub-optimal power efficiency for a product operated at a low voltage and frequency because more power would be consumed than the minimum actually needed to operate with lower performance.

Figures 1A, 1B:
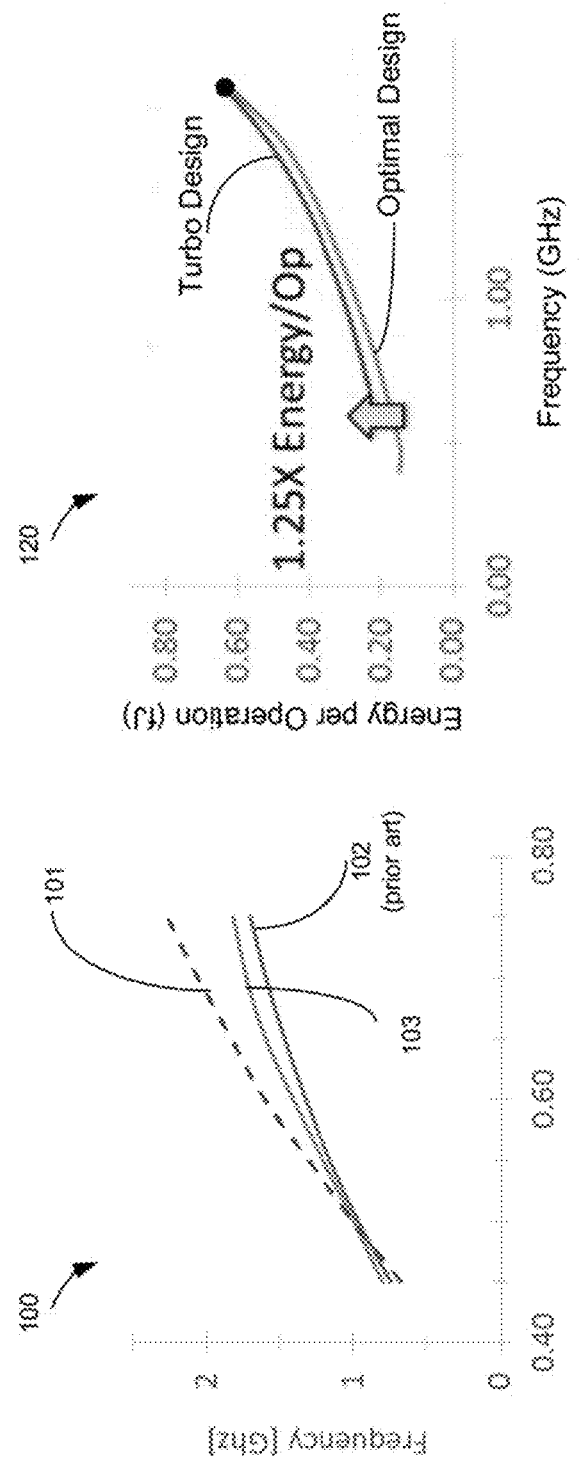
FIG. 1A illustrates a plot comparing performance of a logic in terms of frequency of operation with changing supply voltage for the cases using ideal interconnects, interconnects with resistive effect, and configurable interconnects of some embodiments.
FIG. 1B illustrates a plot showing a design which is optimized to achieve high turbo performance and which may not achieve as low energy as possible even when operating at low power supplies.

FIG. 1A illustrates plot 100 comparing the performance of a logic in terms of frequency of operation with changing supply voltages for the cases with ideal interconnects, interconnects with resistive effect, and configurable interconnects of some embodiments. Here, the x-axis is supply (Vdd) and the y-axis is Frequency (in GHz). Plot 100 shows three curves—101, 102, and 103.

Curve 101 (dotted curve) illustrates a performance of an IC having logic or transistor gate dominated path not substantially comprised of interconnect (e.g., interconnect resistance is much smaller than transistor resistance). For example, logic performance mainly depends on the logic delay and not on the interconnect propagation delay. Here, the interconnect has very low resistivity and frequency is determined by transistor current drive (e.g., an inverse of transistor resistance) which is high at higher supply, resulting in higher frequency and performance, and lower when the logic is operating at lower supply resulting in lower frequency and performance).

Curve 102 illustrates a performance of an IC logic using interconnects designed for a certain supply voltage and performance. In this case, as the supply voltage increases, the increase in frequency of operation is limited by the interconnect propagation delay. Curve 103 illustrates the performance of an IC logic using a configurable interconnect as described with reference to the various embodiments. In this case, as the supply level increases (e.g., Vdd increases from 0.4V to 1.0V), the interconnect delay is reduced to lower levels than curve 102 which allows for higher frequency of operation compared to curve 102. For example, various buffers are dynamically introduced to the logic path to overcome interconnect propagation delay.

Likewise, as the supply level decreases (e.g., 1.0V to 0.4V), the interconnect delay is allowed to increase because the performance may not be the primary concern, but lowering energy with less frequent buffers is. For example, for lower power operation, the various buffers that were dynamically introduced can now be dynamically bypassed. For example, at high voltage, a buffer may decrease total delay but at low voltage the same buffer may increase the total delay compared to the delay seen during low voltage operation of the circuit with a bypassed buffer.

In the second method, IC products are redesigned at two separate performance points appropriate for separate applications (e.g., laptop or desktop). This method can improve upon performance and efficiency when a single design is used in products with different power and performance requirements, but cannot fully address when a single product needs to dynamically adjust its power and performance requirement.

FIG. 1B illustrates plot 120 showing a design (e.g., Turbo Design) which is optimized to achieve high turbo (or highest) performance, and which may not achieve as low energy as possible even when operating at low power supplies. Also this two-design approach is very expensive.

Some embodiments provide a configurable interconnect that achieves the Optimal Design (e.g., lower energy per operation than the Turbo Design) at lower frequency of operation and comparable energy per operation as the Turbo Design at turbo frequency levels (i.e., higher frequencies). Some embodiments describe an apparatus and method to dynamically tune on-chip interconnect and drivers to maximize performance and efficiency in response to the dynamic supply voltages. For example, the apparatus of some embodiments dynamically reconfigures resistance and/or capacitance (R/C) of repeated wires and buses in response to operating voltages. The apparatus of some embodiments opportunistically connects one or more parallel secondary paths at high performance mode (e.g., TURBO mode) improving (e.g., raising) maximum operating frequency (FMAX), and then disconnecting the one or more parallel secondary paths at a lower performance mode (e.g., mode at minimum operating voltage (VMIN)) to save energy per operation. In some embodiments, during the high performance mode, the one or more parallel secondary paths mimic the signal transitions in the primary path. As such, coupling capacitance between the primary path and the one or more secondary paths is reduced.

There are many technical effects of various embodiments. For example, over 15% improvement is observed in maximum frequency during high performance mode (e.g., TURBO mode) and 23% lower energy per operation at minimum operating voltage (VMIN) compared to traditional approaches of reducing wire resistance/capacitance. As such, FMAX improvement with simultaneous decreasing of energy per operation at VMIN is achieved by the apparatus of some embodiments. Some embodiments use standard CMOS process technology with no additional process steps or costs. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The term "scaling" may also refer to adjusting the magnitude of the power supply voltage (e.g., voltage scaling) to the circuit(s).

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

It is to be understood that the terms so used are interchangeable under appropriate circumstances such that the embodiments of the invention described herein are, for example, capable of operation in other orientations than those illustrated or otherwise described herein.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks may be Tunneling FETs (TFETs) or some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used for some transistors without departing from the scope of the disclosure.

Figures 2A, 2B:
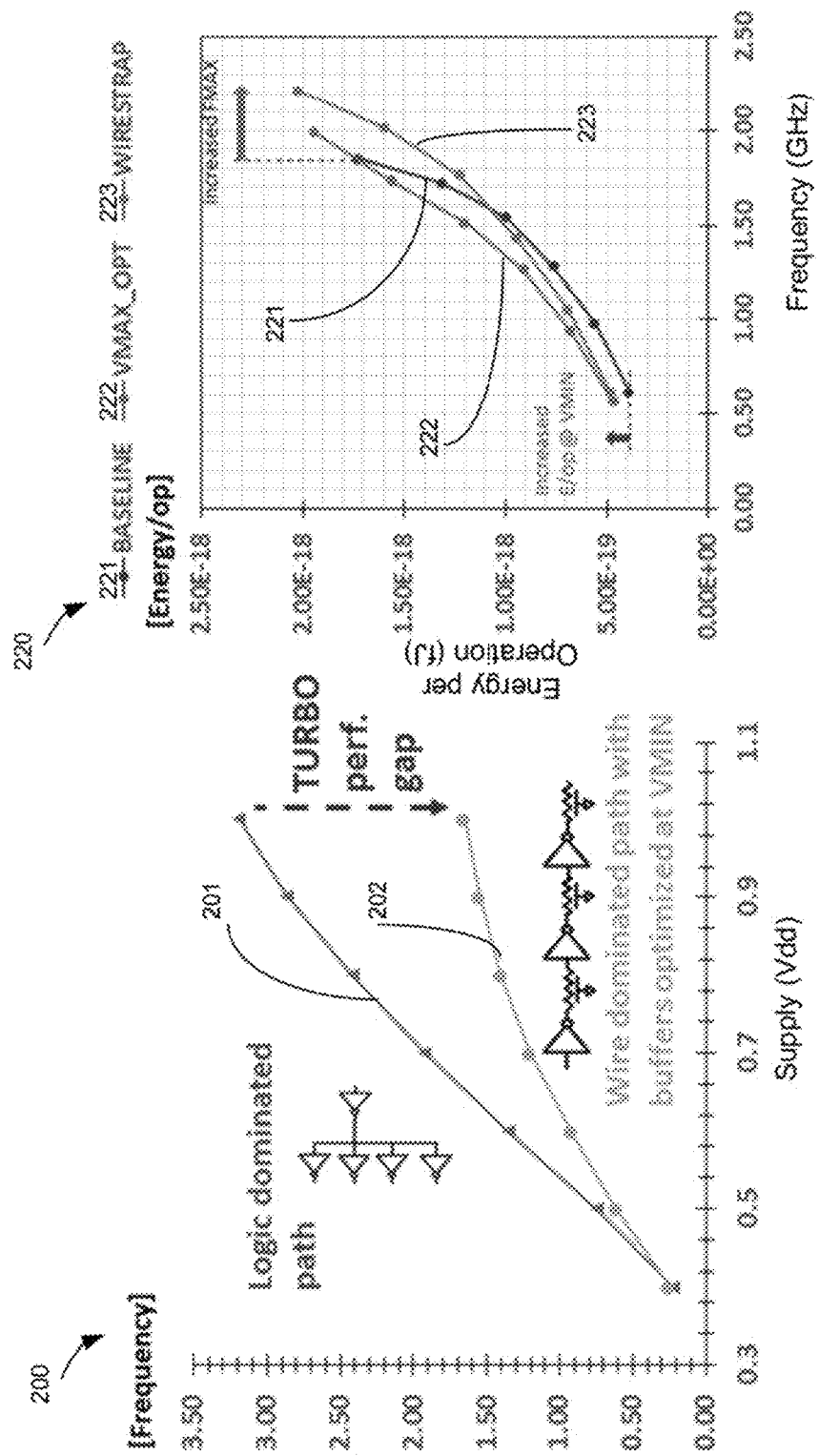
FIG. 2A illustrates a plot showing turbo performance gap between logic and wire dominated paths.
FIG. 2B illustrates a plot showing energy per operation (Energy/op) for three cases—baseline, design optimized at maximum operating voltage (VMAX), and wire strapping.

FIG. 2A illustrates plot 200 showing turbo performance gap between logic and wire dominated paths. FIG. 2B illustrates plot 220 showing energy per operation (Energy/op) for three cases—baseline 221, design optimized at maximum operating voltage (VMAX) 222, and wire strapping 223.

High performance mode (e.g., TURBO mode) of a processor is limited by wire delay within the processor (e.g., wire delay along the critical timing path) as shown by FIG. 2A. Here, two waveforms are shown—201 and 202. Waveform 201 illustrates a logic dominated path and its achievable frequency of operation with various power supply voltages. Waveform 202 illustrates a wire dominated path with buffers within the wire that are optimized to operate at a lowest operating voltage (VMIN), and its achievable frequency of operation with various power supply voltages. Here, the term "VMIN" generally refers to the lowest power supply operating level below which logic does not function properly and storage nodes may lose data. The gap between the highest achievable operating frequency for maximum operating voltage (VMAX) of waveform 201 and 202 is the performance gap (e.g., TURBO performance gap). Here, the term "VMAX" generally refers to a highest power supply operating level above which reliability of active and/or passive devices is compromised.

Unlike transistor or device gate delay, wire delay may not decrease with increase in supply voltage. Technological difficulties in scaling resistance per micron (R/μm) and capacitance per micron (C/μm) of a wire has challenged the future viability of high performance mode of a processor. Conventional approaches such as a regular wire (e.g., baseline 221), optimizing a design at maximum operating voltage (VMAX) (e.g., VMAX_OPT 222), or wire strapping (e.g., 223), improve TURBO FMAX but at the cost of increase in energy per operation (energy/op or E/op) and decrease in performance at VMIN as shown by FIG. 2B. In this example, the baseline 221 is 1× wide with 1× space.

Wire widening is common strategy to reduce wire resistance. A 3W1S is a wire that is 3× wide with 1× space separating it. It is noted with technology scaling wire, widening is restricted by process design rules. Technical reason for that is attributed to the use of multiple patterning to make small pitch wires. But some multiple patterning disallows widening wires to arbitrary widths. Specifically, a commonly used patterning technique called self-aligned patterning allows only for discrete changes in either width or space. With the extensive use of multi-core processors, energy/op and performance at VMIN are first-class design goals alongside TURBO FMAX, and compromising one for another is a sub-optimal solution.

FIGS. 3A-B illustrate baseline designs 300 and 320, respectively, comprising a reconfigurable interconnect using switchable via. Here, a primary interconnect shown on the top can be coupled to a secondary interconnect through switchable vias. The switches can be controlled according to an operating voltage or temperature. During low performance mode (e.g., VMIN or VMID modes), the switches can be opened (e.g., switches are turned off), and during high performance mode (e.g., TURBO mode), the switches can be closed (e.g., switches are turned on) to reduce resistance of the primary interconnect. However, switchable vias require special fabrication process steps and materials that increase cost of manufacturing, and such features may not be available in standard CMOS process technology nodes. In some embodiments, the suitable vias can be replaced with n-type or p-type pass-gates or switches. However, with an over-driving n-type pass-gate switch, the FMAX benefit (e.g., increase in maximum operating frequency) and energy/op improvement is negligible. For example, despite being overdriven, the high ON resistance and parasitic capacitances associated with an n-type transistor delays the signal flowing in the secondary path relative to the primary path. This decreases the self-coupling between the primary path and the secondary path, increasing the effective wire capacitance.

FIG. 4A illustrates plot 400 showing energy per operation (E/op) using baseline design 401 of FIGS. 3A-B and ideal switches. Plot 402 illustrates the E/op when the ideal switch is turned on, and plot 403 illustrates E/op when the idle switch is turned off. Here, the term "ideal switch" generally refers to a controllable switch with zero on resistance and infinite off resistance. FIG. 4B illustrates plot 420 showing E/op using baseline design of FIGS. 3A-B and n-type (e.g., NMOS) switches. Plot 421 illustrates the E/op when the n-type switch is turned on, and plot 422 illustrates E/op when the n-type switch is turned off. Plot 400 shows that with ideal switches, FMAX increases over 15% and E/op decreases over 30% relative to the baseline design. Plot 420 illustrates that, with n-type transistor as controllable switch, there is no FMAX increase. As such, no benefit is observed using n-type switch over ideal switches.

FIG. 5A illustrates an enabled reconfigurable interconnect 500 controlled by power gating, according to some embodiments of the disclosure. For reconfigurable interconnect technique to be effective it is to: a) improve FMAX in TURBO mode; and b) reduce energy/op in VMIN mode. The reconfigurable interconnect 500 accomplishes that with an actively driven one or more secondary paths, that capacitively couple to the primary path, in accordance with some embodiments. The primary path includes buffer/inverter

501*a* followed by a wire which is modeled as an RC network 503, followed by buffer/inverter 501*b*, followed by another wire which is modeled as an RC network 504, followed by buffer/inverter 501*c*, and so on. In some embodiments, the effective resistance and/or capacitance of the primary path is adjusted by enabling/disabling a secondary parallel path.

In some embodiments, the secondary path includes buffer/inverter 502*a* followed by a wire which is modeled as an RC network 503 which includes coupling capacitance, followed by buffer/inverter 502*b*, followed by another wire which is modeled as an RC network 504 which includes coupling capacitance, followed by buffer/inverter 502*c*, and so on. In some embodiments, the secondary path is enabled or disabled by one or more power gate transistors MP_pg. For example, when enable signal (EN) to transistor MP_pg is low, the power gate transistor MP_pg is on, which couples a primary power supply node VCC to a secondary power supply node VCC_s, where the primary power supply node VCC is coupled to the devices in the primary path, and where the secondary power supply node VCC_s is coupled to the devices in the secondary path.

In some embodiments, during a high performance mode (e.g., TURBO mode), the secondary path is enabled (e.g., turned on) by turning on the power gate transistor MP_pg. When the secondary path is enabled, the signal transitions in the primary and secondary paths are aligned (e.g., the falling and rising edges are aligned in time domain). For example, the secondary path mimics the signal transitions in the primary path because the propagation delay and logic inversions between the two paths is substantially identical. The self-coupling capacitance 505 between the primary and secondary paths is also effectively cancelled or reduced when the secondary path is enabled, in accordance with some embodiments. As such, the effective wire capacitance of the primary path is reduced, which improves FMAX.

FIG. 5B illustrates a disabled reconfigurable interconnect 520 controlled by power gating, according to some embodiments of the disclosure. It is pointed out that those elements of FIG. 5B having the same reference numbers (or names) as the elements of any other figure can operate or function in any manner similar to that described, but are not limited to such. Here, the term "power gating" generally refers to controlling availability of power on a power supply node. For example, when power is gated, the power supply on a power supply node is halted, and when power is ungated, the power supply on a power supply node is provided.

In some embodiments, during a low performance mode (e.g., VMIN or VMID mode), the secondary path is disabled (e.g., turned off) by turning on the power gate transistor MP_pg. As such, buffers/inverters 502*a/b/c* and other gates in the secondary path are not powered. The secondary path in one such embodiment serves as a virtual ground, restoring the effective wire capacitance to be similar (or even lower) to the primary path. Effective wire capacitance can be lower than the primary path because when the secondary path is tristated (e.g., it is not actively driven) then the secondary path capacitively couples to the primary path and starts following the primary signal transitions, thereby reducing effective capacitance of the primary. By disabling the secondary path in low performance or low power modes, energy/op is reduced, in accordance with some embodiments.

In some embodiments, the enable signal (EN) is generated by a power management unit (PMU) that can be controlled by hardware or software (e.g., operating system or firmware) . In some embodiments, when the operating power supply is equal to the high performance mode supply (e.g., TURBO mode voltage or VTURBO), then EN is set to 0 (for power gate MP_pg) or else EN is set to 1 (for power gate MP_pg). Circuit simulation of the reconfigurable R/C wire of some embodiments shows that in TURBO mode, FMAX improves an additional 15.47% over the baseline wire, and at lower voltages when the secondary path is disabled, energy/op at VMIN improves.

The reconfigurable wire of some embodiments is beneficial irrespective of voltage at which the circuit is optimized. For example, wire reconfiguration is effective across VMINOPT (circuit optimized at VMIN) optimum minimum operating voltage, VMIDOPT (circuit optimized at VMID which is between VMIN and VMAX), and VMAXOPT (circuit optimized at maximum operating voltage VMAX) voltages. The reconfigurable wire of some embodiments is robust to timing offset between signal transitions in the primary and secondary paths. For example, a timing offset of up to 80% of repeater stage delay still improves FMAX by up to 10%. The reconfigurable wire of some embodiments is also robust across different metal layers with different R/µm and C/µm.

Figure 6A:
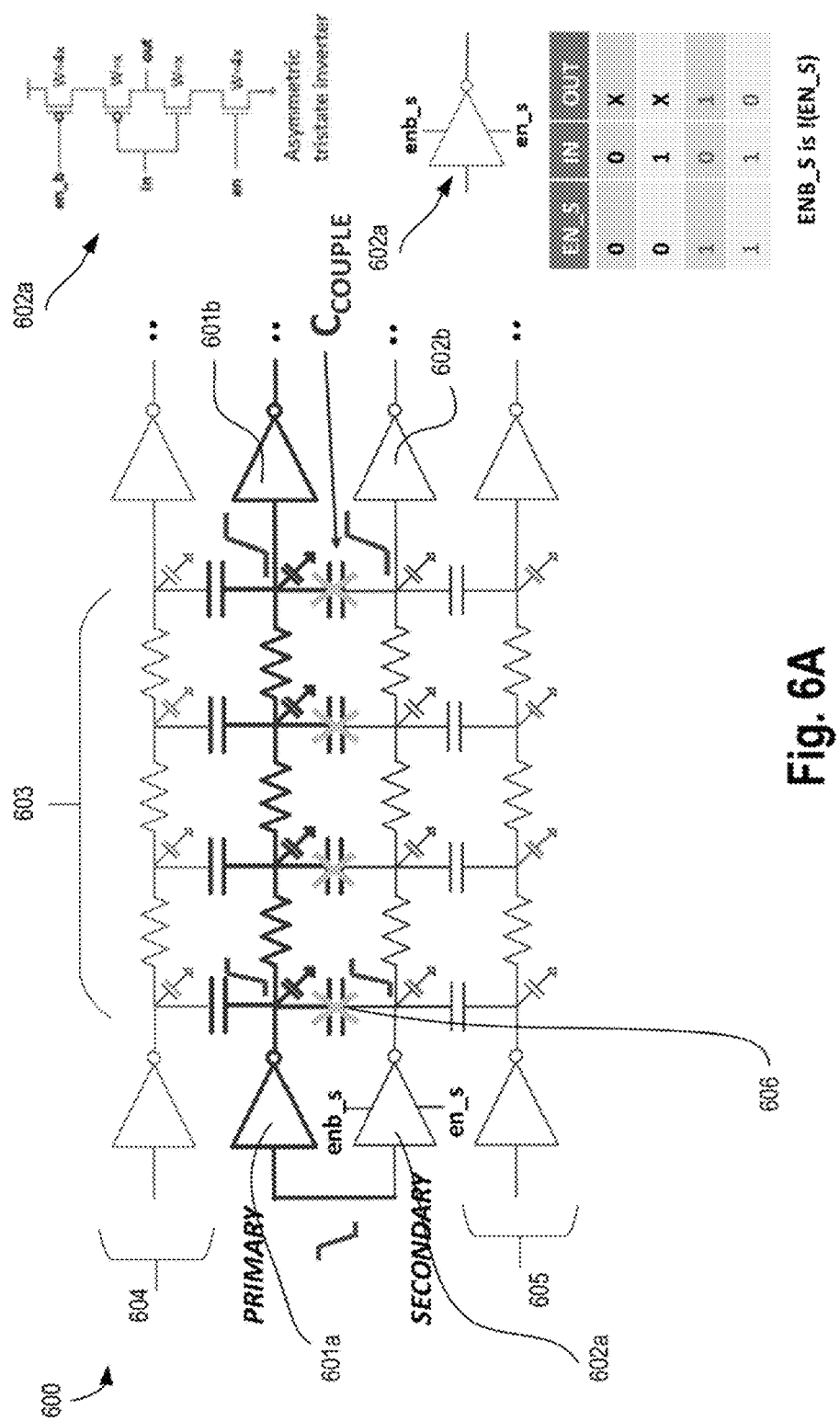
FIG. 6A illustrates an enabled reconfigurable interconnect controlled by control signal(s), according to some embodiments of the disclosure.

FIG. 6A illustrates an enabled reconfigurable interconnect 600 controlled by control signal(s), according to some embodiments of the disclosure. The embodiments described with reference to FIGS. 5A-B rely on effective power-gates with low IR drop to generate the gated power supply (VCC_S) for the secondary path. In some embodiments, CMOS tristate buffers/inverters can be used for the secondary path to provide wire R/C reconfiguration for different operating voltages.

The primary path includes buffer/inverter 601*a* followed by a wire which is modeled as an RC network 603, followed by buffer/inverter 601*b*, followed by another wire which is modeled as an RC network, and so on. In some embodiments, the effective resistance and/or capacitance of the primary path is adjusted by enabling/disabling a secondary parallel path.

In some embodiments, the secondary path includes tristate-able buffer/inverter 602*a*, followed by a wire which is modeled as an RC network 603 which includes coupling capacitance, followed by buffer/inverter 602*b*, and so on. In some embodiments, the secondary path is enabled or disabled by the tristate-able buffer/inverter 602*a* using control enable signals EN_s and its inverter ENb_s. For example, when the enable signal (EN_s) to tristate-able buffer/inverter 602*a* is low, the secondary path is disabled, and when the enable signal (EN_s) to tristate-able buffer/inverter 602*a* is high, the secondary path is enabled. In some embodiments, the first buffer/inverter 602*a* of the secondary path is tristate-able while the other buffers/inverters in the secondary path are ordinary buffers/inverters without tristate capability. As such, routing of EN_s and ENB_s is reduced. In some embodiments, in addition to the first buffer/inverter 602*a* of the secondary path being tristate-able, some or all buffers/inverters in the secondary path are also tristate-able. In some embodiments, when the tristate-able buffer is disabled, its output is a don't care (X) or floating output.

In some embodiments, during a high performance mode (e.g., TURBO mode), the secondary path is enabled (e.g., turned on) by turning on tristate-able buffer or inverter 602*a*. When the secondary path is enabled, the signal transitions in the primary and secondary paths are aligned (e.g., the falling and rising edges are aligned in time domain). For example, the secondary path mimics the signal transitions in the primary path because the propagation delay and logic inversions between the two paths are substantially identical. The self-coupling capacitance 606 between the primary and secondary paths is also effectively cancelled or reduced when the secondary path is enabled, in accordance with some embodiments. As such, the effective wire capacitance of the primary path is reduced which improves FMAX.

In some embodiments, simple swapping of buffers/inverters 602a with CMOS tristate inverters is ineffective as tristate inverters (with series stack of transistors) have inferior drive capability compared to an inverter/buffer. Just up-sizing the tristate inverters may not work. as that may increase the capacitive load seen by the previous driver stage. In some embodiments, this problem is handled by asymmetrically sizing the tristate inverters/buffer 602a such as transistors receiving the data signals are unchanged and the ones receiving enable inputs are upsized. For example, the transistors receiving EN_b (or ENb_s) and EN (or EN_s) have a width which is four times larger than the width of transistors receiving the input signal "in".

Figure 6B:
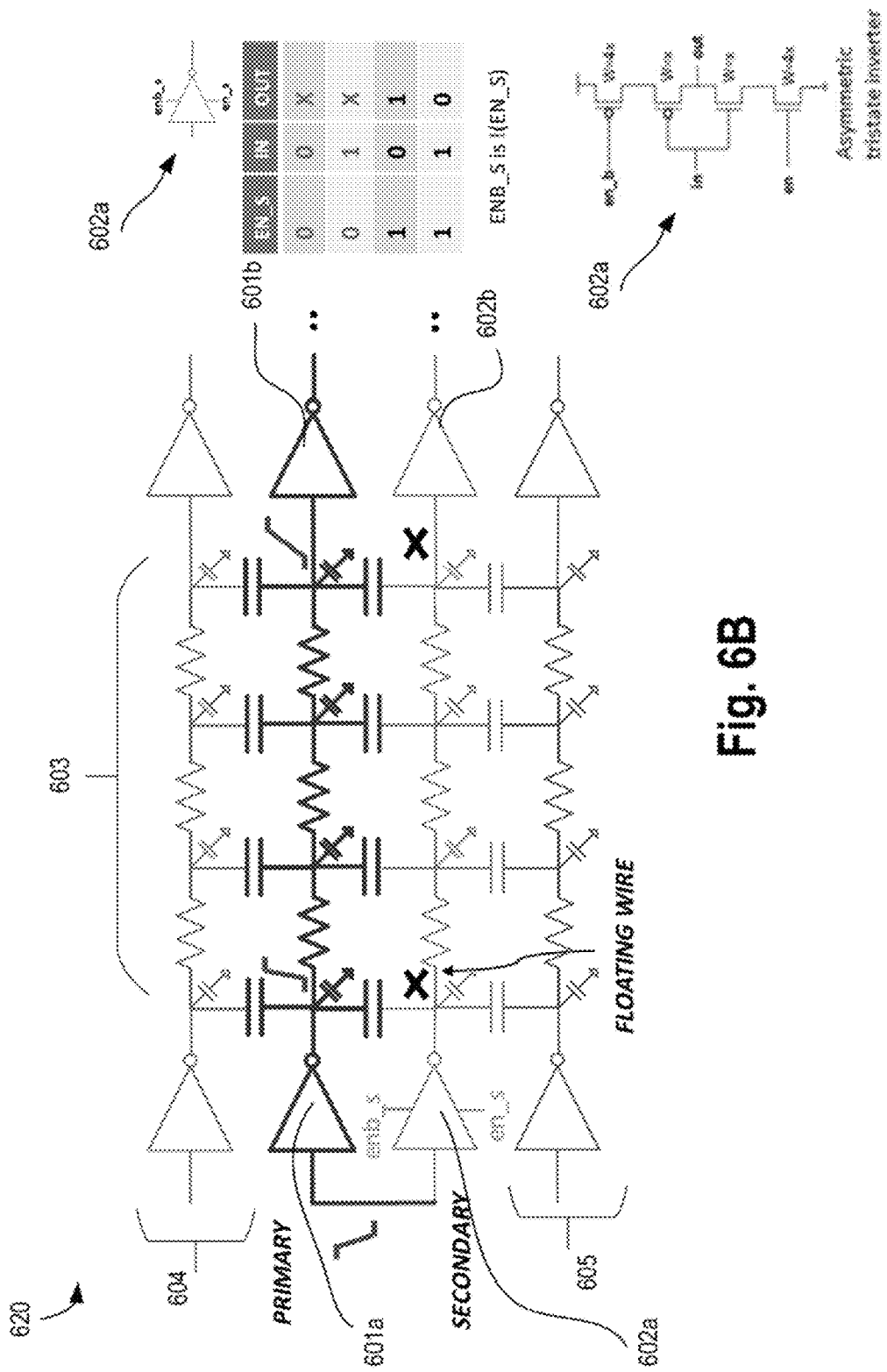
FIG. 6B illustrates a disabled reconfigurable interconnect controlled by control signal(s), according to some embodiments of the disclosure.

FIG. 6B illustrates a disabled reconfigurable interconnect 620 controlled by control signal(s), according to some embodiments of the disclosure. It is pointed out that those elements of FIG. 6B having the same reference numbers (or names) as the elements of any other figure can operate or function in any manner similar to that described, but are not limited to such. In some embodiments, during a low performance mode (e.g., TURBO mode), the secondary path is disabled (e.g., turned off) by turning on tristate-able buffer 602a. When the secondary path is disabled, the nodes in the secondary path are floating. The secondary path in one such embodiment serves as a virtual ground, restoring the effective wire capacitance to be similar to the primary path. By disabling the secondary path in low performance or power modes, energy/op is reduced, in accordance with some embodiments.

While the various embodiments here illustrate one secondary path that can be enabled or disabled, additional secondary paths can be also be used in parallel to the primary path. As such, further improvement in FMAX may be realized at the cost of additional power. In some embodiments, the additional secondary paths (not shown) can be enabled/disabled using the approaches discussed with reference to a single secondary path per primary path.

Figure 7:
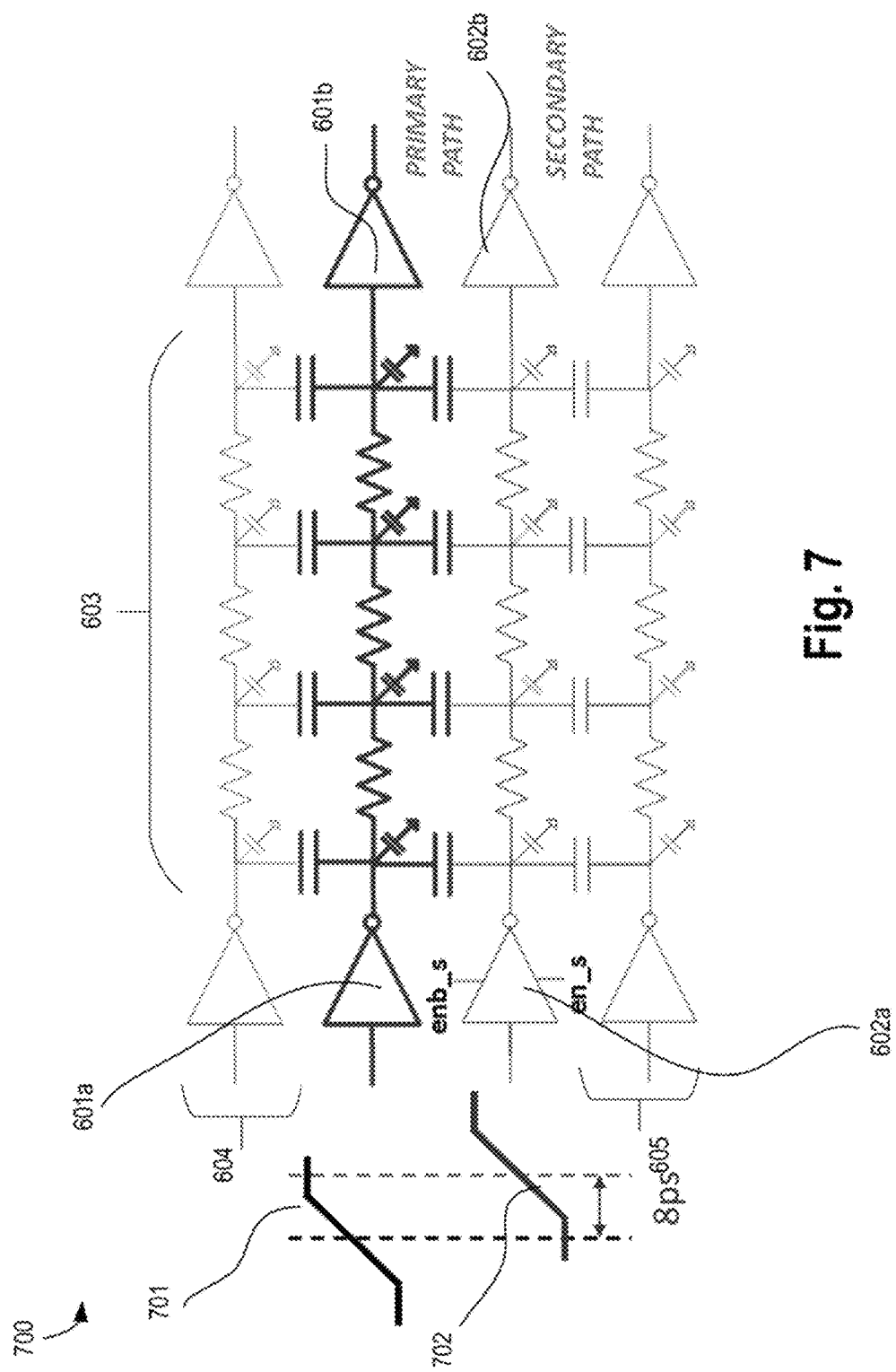
FIG. 7 illustrates a reconfigurable interconnect which is operable with timing offset at its input, according to some embodiments of the disclosure.

FIG. 7 illustrates reconfigurable interconnect 700 which is operable with timing offset at its input, according some embodiments of the disclosure. It is pointed out that those elements of FIG. 7 having the same reference numbers (or names) as the elements of any other figure can operate or function in any manner similar to that described, but are not limited to such. The reconfigurable wire 700 of some embodiments is robust to timing offset between signal transitions 701 and 702 in the primary and secondary paths, respectively. For example, a timing offset of up to 80% of repeater stage delay still improves FMAX by up to 10%.

Figure 8:
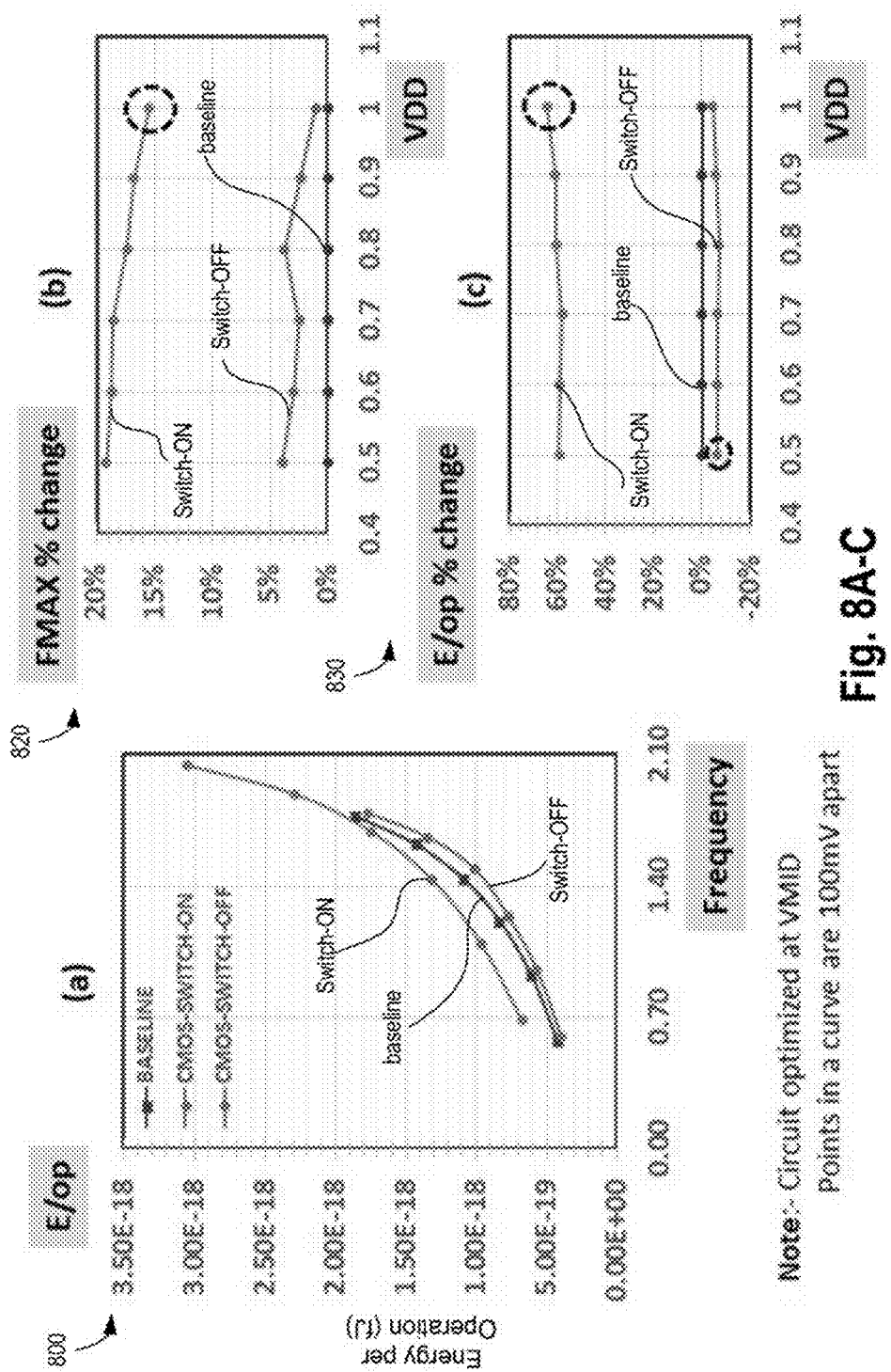
FIG. 8A illustrates a plot showing Energy/Op versus frequency for baseline design and with a secondary path turned on/off (e.g., CMOS switch on/off), according to some embodiments.
FIG. 8B illustrates a plot showing percentage change in maximum frequency (FMAX % change) using baseline design and when the secondary path is turned on/off (e.g., CMOS switch on/off), according to some embodiments.
FIG. 8C illustrates a plot showing percentage change in Energy/Op (E/op % change) using baseline design and when the secondary path is turned on/off (e.g., CMOS switch on/off), according to some embodiments.

FIG. 8A illustrates plot 800 showing Energy/Op versus frequency for baseline design and with secondary path turned on/off (e.g., CMOS switch on/off), according to some embodiments. FIG. 8B illustrates plot 820 showing percentage change in maximum frequency (FMAX % change) using baseline design when secondary path is turned on/off (CMOS switch on/off), according to some embodiments. FIG. 8C illustrates plot 830 showing percentage change in Energy/Op (E/op % change) using baseline design when secondary path is turned on/off (e.g., CMOS switch on/off), according to some embodiments. Circuit simulation of the wire R/C reconfiguration shows that in TURBO mode, FMAX improves an additional 15.47% over the baseline wire (e.g., FIG. 8A, FIG. 8B). At lower voltages, the secondary path is disabled and that improves the energy/op at VMIN (e.g., FIG. 8A, FIG. 8C).

Figure 9:
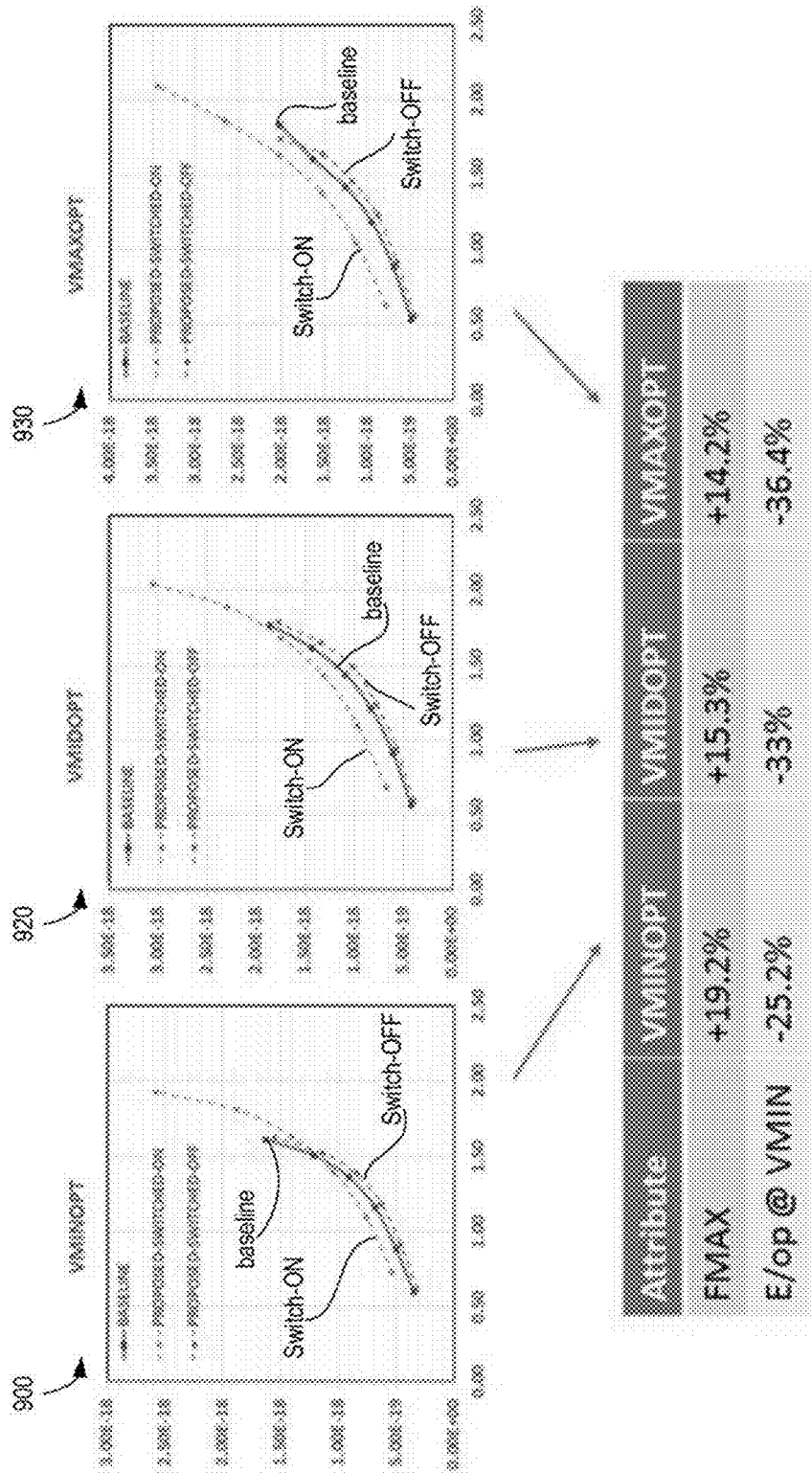
FIGS. 9A-C illustrate plots showing that the reconfigurable interconnect is effective irrespective of the voltage at which the design is optimized, according to some embodiments.

FIGS. 9A-C illustrate plots 900, 920, and 930, respectively, showing that the reconfigurable interconnect is effective irrespective of the voltage at which the design is optimized, according to some embodiments. The reconfigurable wire of some embodiments is beneficial irrespective of voltage at which the circuit is optimized. For example, the reconfigurable wire reconfiguration is effective across VMINOPT, VMIDOPT, and VMAXOPT voltages.

Figure 10:
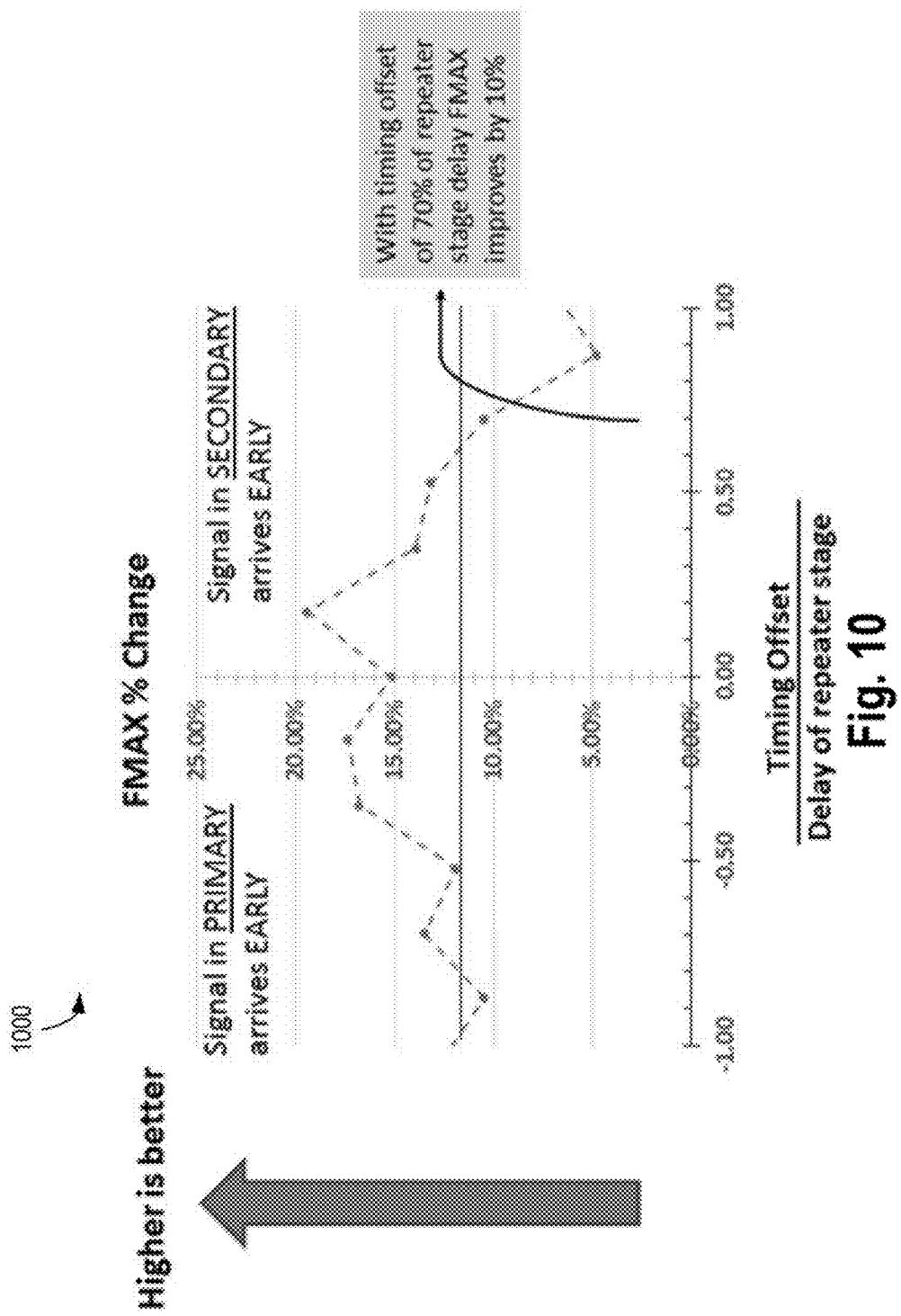
FIG. 10 illustrates a plot showing that the reconfigurable interconnect is effective for an acceptable range of timing delay offset between primary and secondary paths, according to some embodiments.

FIG. 10 illustrates plot 1000 showing that the reconfigurable interconnect is effective for an acceptable range of timing delay offset between primary and secondary paths, according to some embodiments. As discussed with reference to FIG. 7, the reconfigurable wire 700 of some embodiments is robust to timing offset between signal transitions 701 and 702 in the primary and secondary paths, respectively. For example, a timing offset of up to 80% of repeater stage delay still improves FMAX by up to 10%.

Figure 11:
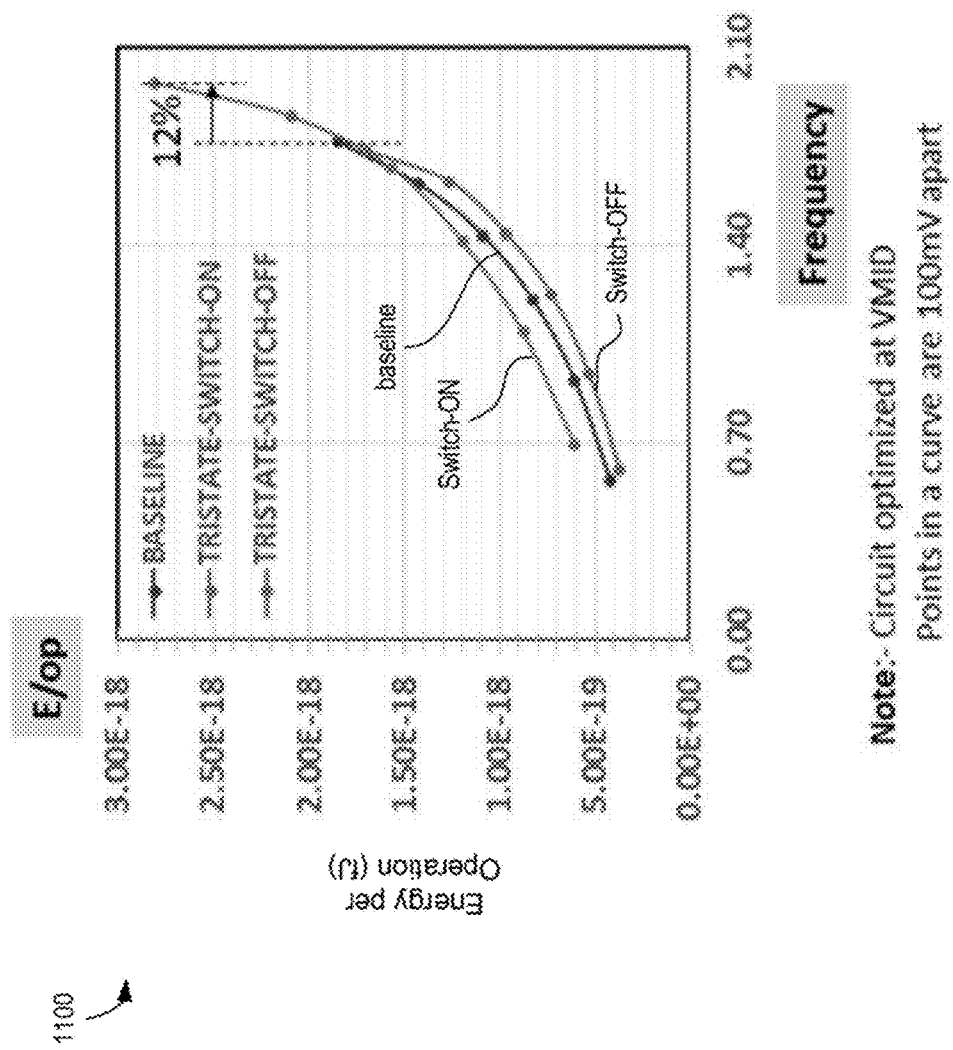
FIG. 11 illustrates a plot showing E/op vs. frequency of baseline design compared with the reconfigurable interconnect, according to some embodiments.

FIG. 11 illustrates plot 1100 showing E/op vs. frequency of baseline design compared with the reconfigurable interconnect, according to some embodiments. In high performance mode (e.g., TURBO mode), tristate inverters/buffers are switched on which improves FMAX by 12%. In lower power mode (e.g., VMIN or VMID mode), tristate/buffers and inverters are switched off and that reduces energy/op at VMIN.

Figure 12:
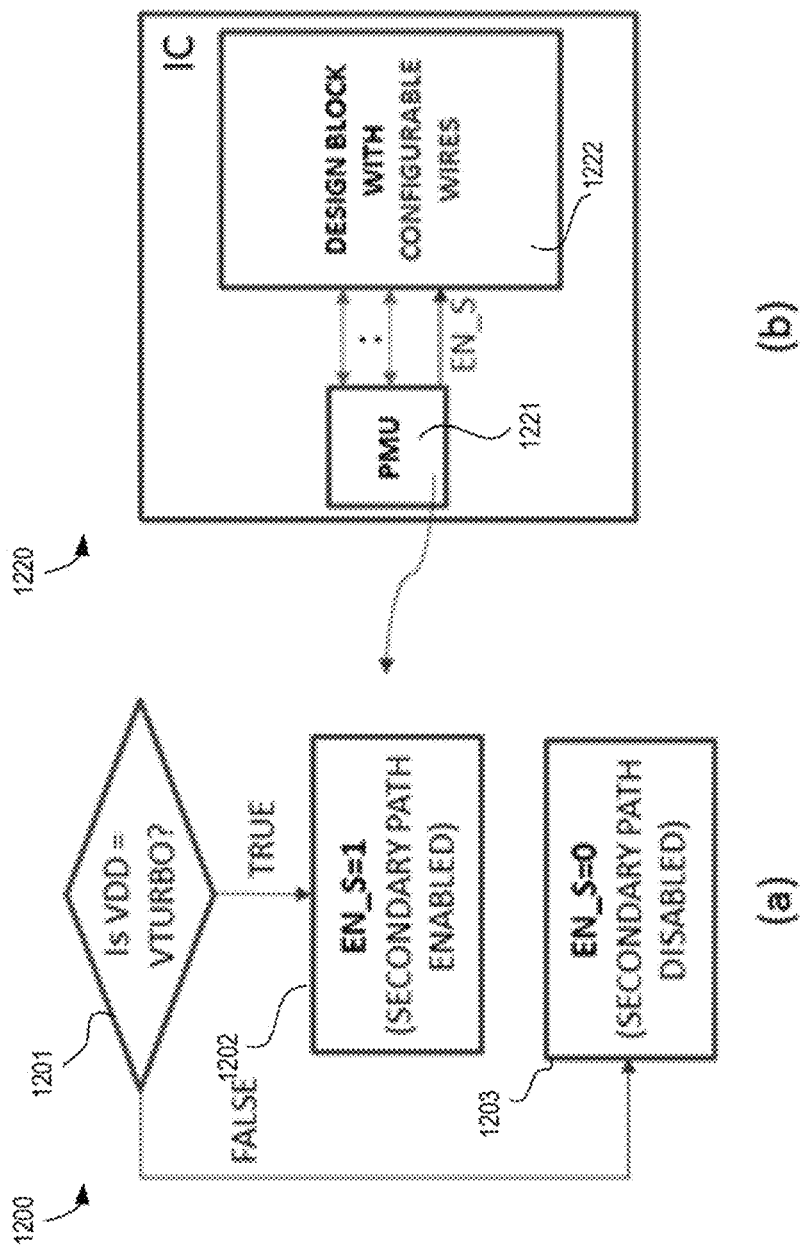
FIG. 12A illustrates a flowchart of a method for configuring the reconfigurable interconnect for different operating modes, in accordance with some embodiments of the disclosure.
FIG. 12B illustrates an apparatus executing the flowchart of FIG. 12A, according to some embodiments of the disclosure.

FIG. 12A illustrates flowchart 1200 of a method for configuring the reconfigurable interconnect for different operating modes, in accordance with some embodiments of the disclosure. It is pointed out that those elements of FIG. 12A having the same reference numbers (or names) as the elements of any other figure can operate or function in any manner similar to that described, but are not limited to such.

Although the blocks in the flowchart with reference to FIG. 12A are shown in a particular order, the order of the actions can be modified. Thus, the illustrated embodiments can be performed in a different order, and some actions/blocks may be performed in parallel. Some of the blocks and/or operations listed in FIG. 12A are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1201, a power management unit (PMU) or another other controller or software determines whether the current power supply (VDD) is same as the maximum allowable power supply or a high performance power supply (e.g., power supply for TURBO mode, VTURBO). If that is the case, the process proceeds to block 1202. At block 1202, one or more secondary paths are enabled (e.g., EN_S is set to 1). If the current power supply is not set to a high performance power supply level, then the process proceeds to block 1203. At block 1203, the one or more secondary paths are disabled. For example, EN_S is set to 0.

FIG. 12B illustrates apparatus 1220 executing the flowchart of FIG. 12A, according to some embodiments of the disclosure. In some embodiments, apparatus 1220 comprises a power management unit (PMU) 1221 in an integrated circuit (IC) which is responsible for enabling/disabling secondary path(s) of the reconfigurable wires 1222.

Figure 13:
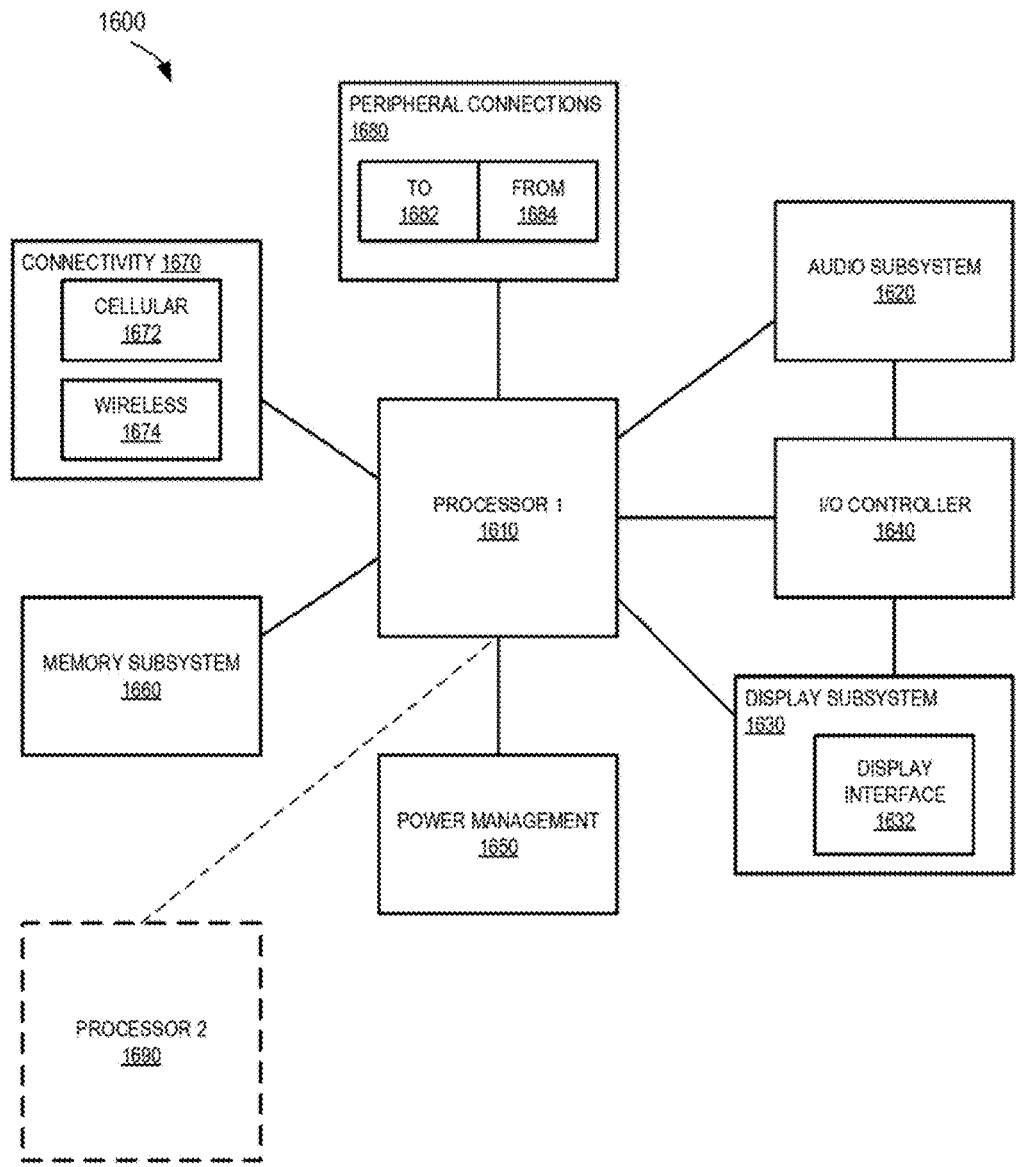
FIG. 13 illustrates a smart device or a computer system or a System-on-Chip (SoC) with one or more reconfigurable interconnect, according to some embodiments.

FIG. 13 illustrates a smart device or a computer system or a System-on-Chip (SoC) with one or more reconfigurable interconnect, according to some embodiments. It is pointed out that those elements of FIG. 13 having the same reference numbers (or names) as the elements of any other figure can operate or function in any manner similar to that described, but are not limited to such.

FIG. 13 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with one or more configurable interconnects, according to some embodiments discussed. Other blocks of the computing device 1600 may also include one or more configurable interconnects, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

EXAMPLE 1

An apparatus comprising: a first driver to receive an input; a first receiver; a first interconnect coupled to an output of the first driver and to an input of the first receiver; a second driver to receive the input; a second receiver; and a second interconnect coupled to an output of the second driver and to an input of the second receiver; wherein the second driver and receiver are controllable to be active during a first operation mode and to be inactive during a second operation mode.

EXAMPLE 2

The apparatus of example 1, wherein the second driver and receiver are controllable by a power gate transistor that is to control presence or absence of power supply to the second driver and receiver.

EXAMPLE 3

The apparatus according to any one of preceding examples, wherein the second driver and receiver comprise tristate-able driver and receiver, respectively.

EXAMPLE 4

The apparatus according to any one of preceding examples, wherein the first operation mode is a high performance mode while the second operation mode is a low performance mode or normal mode.

EXAMPLE 5

The apparatus according to any one of preceding examples, wherein the first and second interconnects are parallel to one another.

EXAMPLE 6

The apparatus according to any one of preceding examples, wherein the first and second drivers have substantially the same propagation delays, and wherein the first and second receivers have substantially the same propagation delays.

EXAMPLE 7

The apparatus according to any one of preceding examples, wherein a first electrical path from the first driver, receiver, and interconnect leads to a target circuit, and wherein a second electrical path from the second driver, receiver, and interconnect leads to the target circuit.

EXAMPLE 8

An apparatus comprising: a first electrical path comprising at least one driver and receiver; and a second electrical path comprising at least one driver and receiver, wherein the first and second electrical paths are to receive a same input signal, wherein the first electrical path and the second electrical path are parallel to one another and have substantially same propagation delays, and wherein the second electrical path is enabled during a first operation mode and disabled during a second operation mode.

EXAMPLE 9

The apparatus of example 8, wherein the at least one driver and receiver of the second electrical path are controllable by a power gate transistor that is to control presence or absence of power supply to the at least one driver and receiver.

EXAMPLE 10

The apparatus according to any one of examples 8 to 9, wherein the at least one driver and receiver of the second electrical path comprises a tristate-able driver and receiver, respectively.

EXAMPLE 11

The apparatus according to any one of examples 8 to 10, wherein the first operation mode is a high performance mode while the second operation mode is a low performance mode or normal mode.

EXAMPLE 12

The apparatus according to any one of examples 8 to 11, wherein the first electrical path leads to a target circuit, and wherein the second electrical path leads to the target circuit.

EXAMPLE 13

A system comprising: a memory; a processor coupled to the memory, the processor operable to execute instructions in a first operation mode and a second operation mode, wherein the processor includes an apparatus according to any one of examples 1 to 7; and a wireless interface to allow the processor to communicate with another device.

EXAMPLE 14

A system comprising: a memory; a processor coupled to the memory, the processor operable to execute instructions in a first operation mode and a second operation mode, wherein the processor includes an apparatus according to any one of examples 8 to 12; and a wireless interface to allow the processor to communicate with another device.

EXAMPLE 15

A method comprising: driving a signal through a first electrical path comprising at least one driver and receiver; switching from a first operation mode to a second operation mode; driving, during the second operation mode, the signal through a second electrical path comprising at least one driver and receiver, wherein the first electrical path and the second electrical path are parallel to one another and have substantially the same propagation delays; switching from the second operation mode to the first operation mode; and halting propagation of the signal through the second electrical path during the first operation mode.

EXAMPLE 16

The method of example 15, wherein the first operation mode is a low performance mode or more mode while the second operation mode is a high performance mode.

EXAMPLE 17

The method according to any one of examples 15 to 17 comprises controlling power supply to the second electrical path such that the power supply is gated during the first operation mode and ungated during the second operation mode.

EXAMPLE 18

An apparatus comprising: means for driving a signal through a first electrical path comprising at least one driver and receiver; means for switching from a first operation mode to a second operation mode; means for driving, during the second operation mode, the signal through a second electrical path comprising at least one driver and receiver, wherein the first electrical path and the second electrical path are parallel to one another and have substantially the same propagation delays; means for switching from the second operation mode to the first operation mode; and means for halting propagation of the signal through the second electrical path during the first operation mode.

EXAMPLE 19

The apparatus of example 18, wherein the first operation mode is a low performance mode or more mode while the second operation mode is a high performance mode.

EXAMPLE 20

The apparatus according to any one of examples 18 to 19 comprises means for controlling power supply to the second electrical path such that the power supply is gated during the first operation mode and ungated during the second operation mode.

EXAMPLE 21

A system comprising: a memory; a processor coupled to the memory, the processor operable to execute instructions in a first operation mode and a second operation mode, wherein the processor includes an apparatus according to any one of examples 18 to 20; and a wireless interface to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first driver to receive an input signal;
a first receiver;
a first interconnect coupled to an output of the first driver and to an input of the first receiver, wherein the first receiver is to receive a first output signal which is a transmitted version of the input signal by the first driver;
a second driver to receive the input signal;
a second receiver;
a second interconnect coupled to an output of the second driver and to an input of the second receiver; wherein the second driver and receiver are controllable to be active during a first operation mode and to be inactive during a second operation mode, wherein the second receiver is to receive a second output signal which is a transmitted version of the input signal by the second driver; and
a power gate transistor to control presence or absence of power supply to the second driver and receiver such that when the power gate transistor is to provide power to the second driver and receiver, signal transitions of the first and second output signals through the first and second interconnect, respectively, are substantially aligned.

2. The apparatus of claim 1, wherein the second driver and receiver comprise tristate-able driver and receiver, respectively.

3. The apparatus of claim 1, wherein the first operation mode is a high performance mode while the second operation mode is a low performance mode.

4. The apparatus of claim 1, wherein the first and second interconnects are parallel to one another.

5. The apparatus of claim 1, wherein the first and second drivers have substantially the same propagation delays, and wherein the first and second receivers have substantially the same propagation delays.

6. The apparatus of claim 1, wherein a first electrical path from the first driver, receiver, and interconnect leads to a target circuit, and wherein a second electrical path from the second driver, receiver, and interconnect leads to the target circuit.

7. An apparatus comprising:
a first electrical path comprising at least one driver and receiver;
a second electrical path comprising at least one driver and receiver, wherein the first and second electrical paths receive a same input signal, wherein the first electrical path and the second electrical path are parallel to one another and have substantially same propagation delays, and wherein the second electrical path is enabled during a first operation mode and disabled during a second operation mode; and
a power gate transistor to control presence or absence of power supply to the at least one driver and receiver of the second electrical path such that when the power gate transistor is to provide power to the at least one driver and receiver of the second electrical path, signal transitions through the first and second electrical paths, respectively, are substantially aligned.

8. The apparatus of claim 7, wherein the at least one driver and receiver of the second electrical path comprises a tristate-able driver and receiver, respectively.

9. The apparatus of claim 7, wherein the first operation mode is a high performance mode while the second operation mode is a low performance mode.

10. The apparatus of claim 7, wherein the first electrical path leads to a target circuit, and wherein the second electrical path leads to the target circuit.

11. A system comprising:
a memory;
a processor coupled to the memory, the processor operable to execute instructions in a first operation mode and a second operation mode, wherein the processor includes:
a first electrical path comprising at least one driver and receiver;
a second electrical path comprising at least one driver and receiver, wherein the first and second electrical paths receive a same input signal, wherein the first electrical path and the second electrical path are parallel to one another and have substantially same propagation delays, and wherein the second electrical path is enabled during the first operation mode and disabled during the second operation mode; and
a power gate transistor to control presence or absence of power supply to the at least one driver and receiver of the second electrical path such that when the power gate transistor provides power to the at least one driver and receiver of the second electrical path, signal transitions through the first and second electrical paths, respectively, are substantially aligned; and
a wireless interface to allow the processor to communicate with another device.

12. The system of claim 11, wherein the at least one driver and receiver of the second electrical path comprises a tristate-able driver and receiver, respectively.

13. The system of claim 11, wherein the first operation mode is a high performance mode while the second operation mode is a low performance mode.

14. The system of claim 11, wherein the first electrical path leads to a target circuit, and wherein the second electrical path leads to the target circuit.

15. A method comprising:
driving a signal through a first electrical path comprising at least one driver and receiver;
switching from a first operation mode to a second operation mode;
driving, during the second operation mode, the signal through a second electrical path comprising at least one driver and receiver, wherein the first electrical path and the second electrical path are parallel to one another and have substantially the same propagation delays;
controlling presence or absence of power supply to the at least one driver and receiver of the second electrical path such that when the power gate transistor is to provide power to the at least one driver and receiver of the second electrical path, signal transitions through the first and second electrical paths, respectively, are substantially aligned;
switching from the second operation mode to the first operation mode; and
halting propagation of the signal through the second electrical path during the first operation mode.

16. The method of claim 15, wherein the first operation mode is a low performance mode while the second operation mode is a high performance mode.

17. The method of claim 15 comprises controlling power supply to the second electrical path such that the power supply is gated during the first operation mode and ungated during the second operation mode.

* * * * *